United States Patent
Hess et al.

(10) Patent No.: US 8,538,587 B2
(45) Date of Patent: Sep. 17, 2013

(54) HVAC SYSTEM WITH AUTOMATED BLOWER CAPACITY DEHUMIDIFICATION, A HVAC CONTROLLER THEREFOR AND A METHOD OF OPERATION THEREOF

(75) Inventors: Mark D. Hess, Plano, TX (US); Roger C. Hundt, Carrollton, TX (US); Stephen A. Walter, Flower Mound, TX (US)

(73) Assignee: Lennox Industries Inc., Richardson, TX (US)

( * ) Notice: Subject to any disclaimer, the term of this patent is extended or adjusted under 35 U.S.C. 154(b) by 315 days.

(21) Appl. No.: 12/694,511

(22) Filed: Jan. 27, 2010

(65) Prior Publication Data

US 2010/0298989 A1  Nov. 25, 2010

Related U.S. Application Data

(60) Provisional application No. 61/180,405, filed on May 21, 2009.

(51) Int. Cl.
*G05B 13/00* (2006.01)
*G05D 23/00* (2006.01)

(52) U.S. Cl.
USPC .......................................... 700/276; 700/278

(58) Field of Classification Search
USPC ................... 700/276, 282, 300, 278; 62/426, 62/498
See application file for complete search history.

(56) References Cited

U.S. PATENT DOCUMENTS

| | | | |
|---|---|---|---|
| 6,170,271 B1* | 1/2001 | Sullivan | 62/93 |
| 6,199,394 B1* | 3/2001 | Maeda | 62/271 |
| 7,395,677 B2* | 7/2008 | Fujiyoshi et al. | 62/324.1 |
| 7,640,761 B2* | 1/2010 | Garrett et al. | 700/282 |
| 2004/0000152 A1* | 1/2004 | Fischer | 62/94 |
| 2006/0185373 A1* | 8/2006 | Butler et al. | 62/181 |
| 2007/0012052 A1* | 1/2007 | Butler et al. | 62/181 |
| 2007/0095082 A1* | 5/2007 | Garrett et al. | 62/180 |
| 2007/0180844 A1* | 8/2007 | Fujiyoshi et al. | 62/271 |
| 2007/0180851 A1* | 8/2007 | Fujiyoshi et al. | 62/480 |
| 2007/0193287 A1* | 8/2007 | Ishida et al. | 62/176.1 |
| 2008/0048045 A1* | 2/2008 | Butler et al. | 236/74 R |
| 2008/0156891 A1* | 7/2008 | Zhou et al. | 236/44 C |
| 2008/0307803 A1* | 12/2008 | Herzon | 62/93 |
| 2010/0082161 A1* | 4/2010 | Patch | 700/276 |

\* cited by examiner

*Primary Examiner* — Charles Kasenge

(57) ABSTRACT

An HVAC controller, a method of operating a HVAC unit and a HVAC system are disclosed herein. In one embodiment, the HVAC controller includes: (1) an interface configured to receive both a latent cooling demand and a sensible cooling demand and (2) a processor configured to direct both a dehumidification function and a cooling function when simultaneously processing both the latent cooling demand and the sensible cooling demand, the dehumidification function based on an operating capacity of an indoor air blower system.

14 Claims, 2 Drawing Sheets

HVAC SYSTEM WITH AUTOMATED BLOWER CAPACITY DEHUMIDIFICATION, A HVAC CONTROLLER THEREFOR AND A METHOD OF OPERATION THEREOF

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," incorporated herein by reference in its entirety.

TECHNICAL FIELD

This application is directed, in general, to heating, ventilating and air conditioning (HVAC) systems and, more specifically, to maximizing the effect of latent cooling in HVAC systems.

BACKGROUND

HVAC systems can be used to regulate the environment within an enclosed space. Typically, an air blower is used to pull air from the enclosed space into the HVAC system through ducts and push the air back into the enclosed space through additional ducts after conditioning the air (e.g., heating, cooling or dehumidifying the air). Various types of HVAC systems, such as rooftop units, may be used to provide conditioned air for enclosed spaces.

HVAC systems may employ different systems or functions for dehumidification. For example, a Humiditrol® dehumidification system from Lennox Incorporated of Richardson, Tex., uses reheat coils for humidity removal. Other HVAC systems without reheat coils may rely on removing humidity by moving air over the evaporation coils during mechanical cooling. This dehumidification process, however, can overcool an enclosed space and create a temperature problem in addition to an existing humidity problem.

SUMMARY

In one aspect, an HVAC controller is disclosed that includes: (1) an interface configured to receive both a latent cooling demand and a sensible cooling demand and (2) a processor configured to direct both a dehumidification function and a cooling function when simultaneously processing both the latent cooling demand and the sensible cooling demand. The dehumidification function is based on an operating capacity of an indoor air blower system.

In another aspect, a method of operating a HVAC unit is disclosed that includes: (1) receiving at least one cooling demand, (2) determining if both a latent cooling demand and a sensible cooling demand are being simultaneously processed and (3) directing both a dehumidification function and a cooling function when simultaneously processing both the latent cooling demand and the sensible cooling demand, the dehumidification function based on an operating capacity of an indoor air blower system.

In yet another aspect, the HVAC system includes: (1) a refrigeration system having at least one compressor, a corresponding evaporator coil and a corresponding condenser coil, (2) an indoor air blower system configured to move air across the evaporator coil, (3) an outdoor fan system configured to move air across the condenser coil and (4) a controller configured to direct operation of the refrigeration system, the indoor air blower system and the outdoor fan system. The controller having: (4A) an interface configured to receive both a latent cooling demand and a sensible cooling demand and (4B) a processor configured to direct both a dehumidification function and a cooling function when simultaneously processing both the latent cooling demand and the sensible cooling demand, the dehumidification function based on an operating capacity of the indoor air blower system.

BRIEF DESCRIPTION

Reference is now made to the following descriptions taken in conjunction with the accompanying drawings, in which.

DETAILED DESCRIPTION

This disclosure provides embodiments that adjust the airflow of an HVAC system in response to a sensible cooling demand when a latent cooling demand is present to deliver improved dehumidification during mechanical cooling. Thus, in the disclosed embodiments, when a latent cooling demand is being processed with a sensible cooling demand, the HVAC systems enter a different mode for improved dehumidification for an enclosed space. The disclosure provides an embodiment of a method that operates a variable indoor air blower(s) or multiple indoor air blowers in response to demands for both sensible and latent cooling to maximize the effect of latent cooling. Compressors (or a single variable capacity compressor) and outdoor fans (or a single variable outdoor fan) may also be controlled in response to both a sensible and latent cooling demand. The method may be embodied as firmware. In some embodiments, the method may be implemented as a series of operating instructions that direct the operation of a processor, such as a processor of a controller. The controller may be a rooftop unit controller (RTU) for a rooftop HVAC system.

By controlling the operation of an HVAC system as disclosed herein, a lower capacity for an indoor air blower can be coupled with a high compressor capacity to lower an evaporator temperature and maximize the latent cooling provided during the time frame of the sensible cooling demand. The various embodiments may also reduce power consumption by operating an outdoor fan system at low capacity to match a lower evaporator load due to reduced air movement over the evaporator. Additionally, by operating the indoor air blower at a lower capacity instead of a high capacity for a given sensible cooling demand (i.e., a sensible cooling demand for high capacity), a compressor may run longer than it would otherwise while servicing the given sensible cooling demand. Thus, more latent cooling may be provided for a given amount of sensible cooling. Disclosed embodiments may also more effectively avoid the buildup of latent load by avoiding running the cooling elements of an HVAC system (a compressor system, an indoor air blower system and an outdoor fan system) at a low capacity for a low sensible demand while a latent demand is present.

Figure 1:
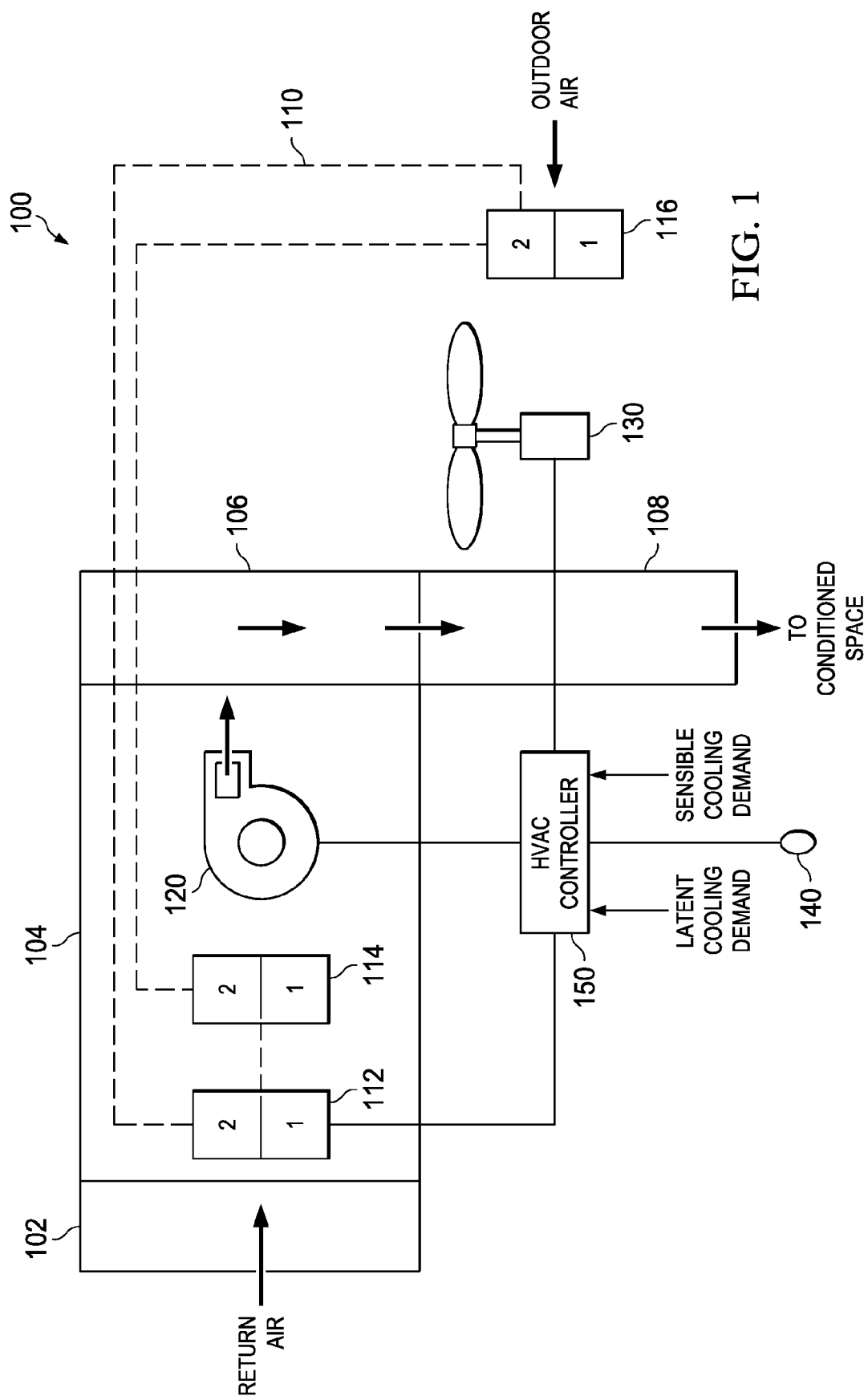
FIG. 1 is a block diagram of an embodiment of an HVAC system constructed according to the principles of the disclosure.

FIG. 1 is a block diagram of an embodiment of an HVAC system 100 constructed according to the principles of the disclosure. The HVAC system 100 includes a return duct 102, a return plenum 104, a supply duct 106 and a supply plenum 108. Additionally, the HVAC system 100 includes a refrigeration circuit 110, an indoor air blower system 120, an outdoor fan 130, a humidity sensor 140 and a HVAC controller 150. The refrigeration circuit 110 includes a compressor system 112, evaporator coils 114 and condenser coils 116. The compressor system 112, the evaporator coils 114 and the condenser coils 116 each include two units as denoted by the numbers 1-2 in FIG. 1. The multiple units of the refrigeration system represent two cooling stages of the HVAC system 100. Each of the components of the refrigeration circuit 110 is fluidly coupled together.

One skilled in the art will understand that the HVAC system 100 may include additional components and devices that are not presently illustrated or discussed but are typically included in an HVAC system, such as, a power supply, an expansion valve, etc. A thermostat (not shown) is also typically employed with the HVAC system 100 and used as a user interface. The various illustrated components of the HVAC system 100 may be contained within a single enclosure (e.g., a cabinet). The HVAC system 100 may be a variable air volume (VAV) system. In a VAV system, the temperature of the supply air for an enclosed space is substantially constant and the air flow rate is varied to meet the thermal changes in the enclosure. In one embodiment, the HVAC system 100 is a rooftop unit.

The refrigeration circuit 110, the indoor air blower system 120, the outdoor fan system 130 and the humidity sensor 140 may be conventional devices that are typically employed in HVAC systems. At least some of the operation of the HVAC system 100 can be controlled by the HVAC controller 150 based on inputs from various sensors of the HVAC system 100 including the humidity sensor 140. For example, the HVAC controller 150 can cause the indoor air blower system 120 to move air across the evaporator coils 114 and into an enclosed space.

In one embodiment, the indoor air blower system 120, the outdoor fan system 130 and the compressor system 110 include at least one indoor air blower, at least one outdoor fan and at least one compressor, respectively, configured to operate at variable capacities. In some embodiments, the variable capacities may be based on variable motor speeds. In some embodiments, the indoor air blower system, the outdoor fan system and the compressor system may include multiple units. In those embodiments having multiple units, at least one of the multiple units may operate at variable capacities. In other embodiments having multiple units, the units may not operate at various capacities but the HVAC controller 150 may control operation of the multiple units to control the amount of air flow for dehumidification. In such embodiments, components of the refrigeration circuit 110 of the various cooling elements of the HVAC system 100 may be operated sequentially in stages.

The HVAC controller 150 may include a processor, such as a microprocessor, configured to direct the operation of the HVAC system 100. Additionally, the HVAC controller 150 may include a memory section including instructions that direct the operation of the processor. The memory section may be a conventional memory. The memory section may include a series of operating instructions that direct the operation of the HVAC controller 150 (e.g., the processor) when initiated thereby. The series of operating instructions may represent algorithms that are used to operate a dehumidification function for the HVAC system 100 by controlling operating capacities of the various components of the HVAC system 100 in response to processing both a sensible cooling demand and a latent cooling demand at the same time.

The HVAC controller 150 receives and responds to cooling demands for the HVAC system 100. As illustrated, the cooling demands may be a latent cooling demand or a sensible cooling demand. A latent cooling demand is used for dehumidification. A latent cooling demand may be the result of high humidity in the enclosed space or even in outside air being used by the HVAC system 100. The HVAC system 100 reduces humidity by moving air over the evaporator coils 114.

The humidity sensor 140 may be used to initiate a latent cooling demand. The humidity sensor 140 may be located in the enclosed space. In some embodiments, the humidity sensor 140 may be located proximate a thermostat of the HVAC system 100. In other embodiments, the humidity sensor 140 may be located on a different wall in the enclosed space than the thermostat. The humidity sensor 140 may be, for example, a humidistat.

A sensible cooling demand may be the result of a high dry-bulb temperature in the enclosed space or even a high dry-bulb temperature of outside air being used by the HVAC system 100. A sensible cooling demand may be from a thermostat, a space temperature sensor or a network communication of this demand. The HVAC controller 150 receives and processes sensible cooling demands. The sensible cooling demands may be for different loads, such as high, medium or low, based on, for example, the temperature in the enclosed space. In response, the HVAC controller 150 responds by operating the compressor system 112, the indoor blower system 120 and the outdoor fan system 130 at a designated air volume capacity (e.g., corresponding capacities such as high, medium or low). The various corresponding operating capacities may be obtained by varying the speed of variable speed motors. Additionally, the corresponding operating capacities may be obtained by activating the different cooling elements in stages. The HVAC controller 150 directs the activation of the various cooling elements for the received sensible cooling demands. For example, when a low sensible cooling demand is detected by the HVAC controller 150, the designated capacity is for low capacity. When a high sensible cooling demand is detected by the HVAC controller 150, the designated capacity is for high capacity.

The HVAC controller 150 is also configured to control operation of the HVAC system 100 when processing both a latent cooling demand and a sensible cooling demand at the same time. The HVAC controller 150 is configured to direct both a dehumidification function and a cooling function when simultaneously processing both the latent cooling demand and the sensible cooling demand. Simultaneous processing may occur when both a sensible cooling demand and a latent cooling demand are received within designated time period. The designated time period may be HVAC system specific. In one embodiment, the HVAC controller 150 may simultaneously process both a sensible and latent cooling demand when a latent cooling demand is received while a sensible cooling demand is being processed. The dehumidification function may be based on an operating capacity of the indoor air blower system 120.

When both latent and sensible cooling demands are present at the same time, the HVAC controller 150 operates both the indoor air blower system 120 and the outdoor fan system 130 at a low capacity. Additionally, the HVAC controller 150 is configured to operate the compressor system 112 at a high capacity. In one embodiment, the low capacity is based on an operating capacity for a low sensible demand and the high capacity is based on an operating capacity for a high sensible demand.

As illustrated in FIG. 1, the HVAC controller 150 is coupled to the various components of the HVAC system 100.

In some embodiments, the connections therebetween are through a wired-connection. A conventional cable and contacts may be used to couple the HVAC controller 150 to the various components of the HVAC system 100. In other embodiments, a wireless connection may also be employed to provide at least some of the connections.

Figure 2:
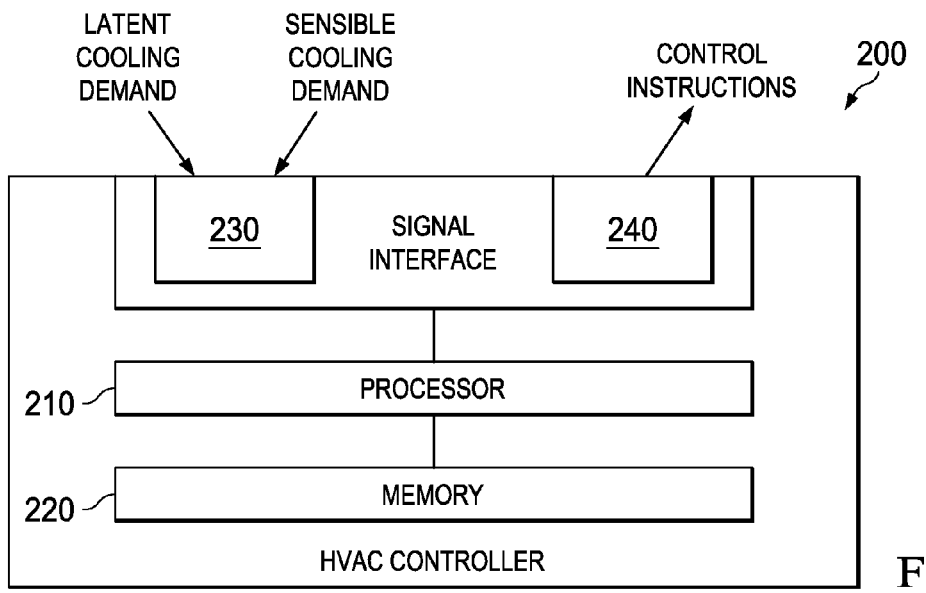
FIG. 2 is a diagram of an embodiment of a HVAC controller constructed according to the principles of the disclosure.

FIG. 2 is a block diagram of an embodiment of an HVAC controller 200 constructed according to the principles of the disclosure. The HVAC controller 200 is configured to control operations of an HVAC system. The HVAC controller 200 includes a processor 210 and a memory section 220. Additionally, the HVAC controller 200 includes additional components such as a signal interface having an input port 230 and an output port 240. The HVAC controller 200 may also include other components typically included within a controller for a HVAC system, such as a power supply or power port. The processor 210 is configured to direct both a dehumidification function and a discharge air temperature control function for a HVAC system employing a latent cooling demand and a sensible cooling demand. Latent and sensible cooling demands may be received at the input port 230 of the signal interface. Control instructions may then be transmitted via the output port 240 of the signal interface.

The memory 220 may be a conventional memory. The memory 220 may include a series of operating instructions that direct the operation of the processor 210 when initiated thereby. The series of operating instructions may represent algorithms that are used to direct both a dehumidification function and a cooling function for a HVAC system when simultaneously processing both a latent cooling demand and a sensible cooling demand. The HVAC system may be a rooftop unit. The algorithm may be represented by the flow diagram illustrated in FIG. 3.

Figure 3:
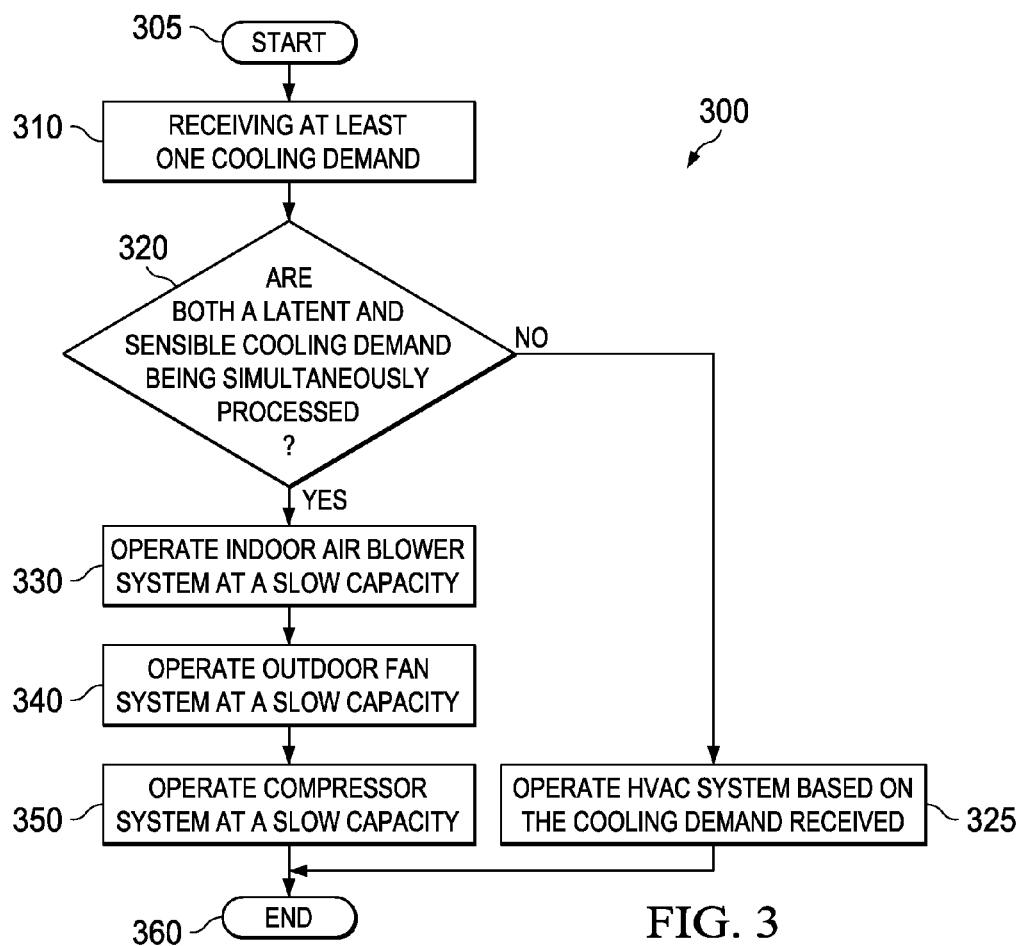
FIG. 3 is a flow diagram of an embodiment of a method of operating a HVAC system carried out according to the principles of the disclosure.

FIG. 3 is a flow diagram of an embodiment of a method 300 of operating a HVAC unit carried out according to the principles of the disclosure. The HVAC unit includes a refrigeration circuit, an indoor air blower system and an outdoor fan system. Additionally, the HVAC unit includes a dehumidification function. An HVAC controller such as described with respect to FIG. 1 or FIG. 2 may be used to perform the method 300. The method 300 may represent an algorithm that is stored on a computer readable medium, such as a memory of an HVAC controller (e.g., the memory 220 of FIG. 2) as a series of operating instructions that can direct the operation of a processor (e.g., the processor 210 of FIG. 2). The method 300 begins in a step 305.

In a step 310, a cooling demand is received by a controller for an HVAC unit. The cooling demand may be a latent cooling demand or a sensible cooling demand. The cooling demands may be received at the controller via an interface. The interface may be an input port. Both cooling demands may be received at approximately the same time. In some embodiments, a sensible cooling demand may have already been received and already being processed (e.g., activating and operating the various cooling elements in response to the sensible cooling demand).

A determination is then made in a first decisional step 320 if both a latent cooling demand and a sensible cooling demand are being simultaneously processed. In one embodiment, a latent cooling demand and a sensible cooling demand may be simultaneously processed if received by the controller within a designated period of time.

If both a latent cooling demand and a sensible cooling demand are being simultaneously processed, the controller operates the indoor air blower system at a low capacity (or a lower capacity) in a step 330. This is the case even if the sensible cooling demand calls for a higher capacity. In some embodiments, the low capacity is a lower capacity than the sensible cooling demand calls requests. In a step 340, the controller operates an outdoor fan system of the HVAC system at a low capacity. Additionally, the controller operates a compressor system of the HVAC system at a high capacity (or a higher capacity) in a step 350. The high capacity may correspond to the sensible cooling demand. The method 300 then continues to step 350 and ends.

Returning now to step 320, if both of the cooling demands are not being simultaneously processed, the method 300 continues to a step 325 where the controller operates the HVAC system based on the cooling demand received. If only a latent cooling demand was received, the HVAC controller will not activate the cooling elements of the HVAC system. If a sensible cooling demand was received, the controller will activate a cooling function for the HVAC system based on the sensible cooling demand. The method 300 continues to step 350 and ends.

The above-described methods may be embodied in or performed by various conventional digital data processors, microprocessors or computing devices, wherein these devices are programmed or store executable programs of sequences of software instructions to perform one or more of the steps of the methods, e.g., steps of the method of FIG. 3. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 3. Additionally, an apparatus, such as dedicated HVAC controller, may be designed to include the necessary circuitry to perform each step of the methods of FIG. 3.

Those skilled in the art to which this application relates will appreciate that other and further additions, deletions, substitutions and modifications may be made to the described embodiments.

What is claimed is:

1. A controller for a heating, ventilating and air conditioning (HVAC) system having an indoor air blower system configured to operate at multiple air volume capacities including a low indoor capacity and a high indoor capacity and a compressor system configured to operate at multiple air volume capacities including a low compressor capacity and a high compressor capacity, wherein said high indoor capacity is a higher air volume operating capacity than said low indoor capacity and said high compressor capacity is a higher air volume operating capacity than said low compressor capacity, said controller comprising:
   an interface configured to receive both a latent cooling demand and a sensible cooling demand; and
   a processor configured to direct both a dehumidification function and a cooling function when simultaneously processing both said latent cooling demand and said sensible cooling demand, said dehumidification function based on an operating capacity of said indoor air blower system, wherein said processor simultaneously operates said indoor air blower system at said low indoor capacity and said compressor system at said high compressor capacity when simultaneously processing said latent cooling demand and said sensible cooling demand.

2. The HVAC controller as recited in claim 1 wherein said HVAC system further includes an outdoor fan system configured to operate at multiple air volume capacities including a low outdoor capacity and a high outdoor capacity and said processor is further configured to operate said outdoor fan system at said low outdoor capacity when simultaneously processing said latent cooling demand and said sensible cooling demand, wherein said high outdoor capacity is a higher air volume operating capacity than said low outdoor capacity.

3. The HVAC controller as recited in claim 1 wherein said indoor air blower system includes at least one indoor air blower configured to operate at variable air volume capacities.

4. The HVAC controller as recited in claim 1 wherein said controller is a rooftop unit controller.

5. The HVAC controller as recited in claim 2 wherein said HVAC system is configured to operate under multiple sensible cooling demands including a low sensible cooling demand and a high sensible cooling demand, wherein said high sensible cooling demand is for a higher cooling load than said low sensible cooling demand, and said low outdoor capacity for said outdoor fan system is based on an operating capacity for said low sensible cooling demand and said high compressor capacity for said compressor system is based on an operating capacity for said high sensible cooling demand.

6. A method of operating a heating, ventilating and air conditioning (HVAC) unit having an indoor air blower system configured to operate at multiple air volume capacities including a low indoor capacity and a high indoor capacity and a compressor system configured to operate at multiple air volume capacities including a low compressor capacity and a high compressor capacity, wherein said high indoor capacity is a higher air volume operating capacity than said low indoor capacity and said high compressor capacity is a higher air volume operating capacity than said low compressor capacity, said method comprising:
  receiving at least one cooling demand;
  determining if both a latent cooling demand and a sensible cooling demand are being simultaneously processed; and
  directing both a dehumidification function and a cooling function when simultaneously processing both said latent cooling demand and said sensible cooling demand, said dehumidification function based on an operating capacity of said indoor air blower system, wherein said directing is performed by a processor, wherein said directing comprises simultaneously operating said indoor air blower system at said low indoor capacity and said compressor system at said high compressor capacity.

7. The method as recited in claim 6 wherein said HVAC system further includes an outdoor fan system configured to operate at multiple air volume capacities including a low outdoor capacity and a high outdoor capacity, wherein said high outdoor capacity is a higher air volume operating capacity than said low outdoor capacity, said directing further comprising operating said outdoor fan system at said low capacity.

8. The method as recited in claim 6 wherein said indoor air blower system includes at least one indoor air blower configured to operate at variable air volume capacities.

9. The method as recited in claim 6 wherein said processor is a rooftop unit controller.

10. The method as recited in claim 7 wherein said HVAC system is configured to operate under multiple sensible cooling demands including a low sensible cooling demand and a high sensible cooling demand, wherein said high sensible cooling demand is for a higher cooling load than said low sensible cooling demand, and said low outdoor capacity for said outdoor fan system is based on an operating capacity for a low sensible cooling demand and said high compressor capacity for said compressor system is based on an operating capacity for said high sensible cooling demand.

11. A heating, ventilating and air conditioning (HVAC) system, comprising:
  a refrigeration system having at least one compressor, a corresponding evaporator coil and a corresponding condenser coil, said at least one compressor being configured to operate at multiple air volume capacities including a low compressor capacity and a high compressor capacity, wherein said high compressor capacity is a higher air volume operating capacity than said low compressor capacity;
  an indoor air blower system configured to move air across said evaporator coil at multiple air volume capacities including a low indoor capacity and a high indoor capacity, wherein said high indoor capacity is a higher air volume operating capacity than said low indoor capacity;
  an outdoor fan system configured to move air across said condenser coil at multiple air volume capacities including a low outdoor capacity and a high outdoor capacity, wherein said high outdoor capacity is a higher air volume operating capacity than said low outdoor capacity; and
  a controller configured to direct operation of said refrigeration system, said indoor air blower system and said outdoor fan system, comprising:
    an interface configured to receive both a latent cooling demand and a sensible cooling demand, wherein said high sensible cooling demand is for a higher cooling load than said low sensible cooling demand; and
    a processor configured to direct both a dehumidification function and a cooling function when simultaneously processing both said latent cooling demand and said sensible cooling demand, said dehumidification function based on an operating capacity of said indoor air blower system, wherein said processor simultaneously operates said indoor air blower system at said low indoor capacity and said compressor system at said high compressor capacity when simultaneously processing said latent cooling demand and said sensible cooling demand.

12. The HVAC system as recited in claim 11 wherein said processor is further configured to operate said outdoor fan system at said low outdoor capacity when simultaneously processing said latent cooling demand and said sensible cooling demand.

13. The HVAC system as recited in claim 11 wherein said HVAC system is a variable air volume system.

14. The HVAC system as recited in claim 11 wherein said indoor air blower system includes at least one indoor air blower configured to operate at variable air volume capacities.

* * * * *